United States Patent [19]

Pulvirenti

[11] Patent Number: 5,804,956
[45] Date of Patent: Sep. 8, 1998

[54] CURRENT LIMITATION PROGRAMMABLE CIRCUIT FOR SMART POWER ACTUATORS

[75] Inventor: Francesco Pulvirenti, Acireale, Italy

[73] Assignee: Co.Ri.M.Me.-Consorzio per la Ricerca sulla Microelettronica nel Messogiorno, Catania, Italy

[21] Appl. No.: 805,213

[22] Filed: Feb. 27, 1997

[51] Int. Cl.⁶ ................................................ G05F 1/573
[52] U.S. Cl. ................................................... 323/277
[58] Field of Search ..................................... 323/277, 282

[56] References Cited

U.S. PATENT DOCUMENTS

| 4,841,219 | 6/1989 | Lonergan | 323/277 |
| 4,899,098 | 2/1990 | Gariboldi | 323/277 |
| 5,113,307 | 5/1992 | Meyer et al. | 361/154 |
| 5,631,549 | 5/1997 | Hong | 323/277 |
| 5,637,990 | 6/1997 | Kato et al. | 323/277 |

FOREIGN PATENT DOCUMENTS

| 0 483 744 A2 | 5/1992 | European Pat. Off. | H02M 7/537 |
| 0 554 936 A1 | 8/1993 | European Pat. Off. | H03K 17/60 |
| 0 556 663 A1 | 8/1993 | European Pat. Off. | G05F 1/565 |
| 0 647 026 A2 | 4/1995 | European Pat. Off. | H03K 17/082 |

Primary Examiner—Stuart N. Hecker
Attorney, Agent, or Firm—Michele A. Mobley; Jenkens & Gilchrist

[57] ABSTRACT

A circuit for limitation of maximum current delivered by a power transistor comprises: a network for detection of the current delivered by the power transistor which generates a first electrical signal; a reference network for generating a reference current proportional to a resistor and self-limited, provided by means of a current generator circuit and a limiting circuit with current mirror; and an operational amplifier which compares the first electrical signal with the reference current and which tends to inhibit the power transistor if the current delivered exceeds a certain threshold value.

9 Claims, 2 Drawing Sheets

CURRENT LIMITATION PROGRAMMABLE CIRCUIT FOR SMART POWER ACTUATORS

FIELD OF THE INVENTION

The present invention relates to a circuit for protection of the output stage of an intelligent power actuator from overloads and short circuits. The need for protecting these devices which can be switches, amplifiers and voltage or current regulators appears obvious when the power in play becomes high because an overload or an accidental short circuit could irreparably damage both the load and the device.

In many applications and in particular in current regulators it is often required that the limitation current be programmable from outside the integrated circuit.

PRIOR ART

The output stage of the device which is the subject of the present invention is provided by means of a power transistor and the technique used for limiting the current is that of driving the above mentioned transistor with a negative feedback network which tends to inhibit the transistor when the current running therein exceeds a certain predefined threshold. The simplest way to detect the current is that of measuring the voltage drop on a resistor—termed 'sense' resistor—placed in series with the power transistor.

However, in the case of 'low drop' applications, i.e. in which the voltage drop on the power transistor must be very low, this technique has the obvious disadvantage of increasing the voltage drop and requiring, as a sense resistor, a resistor with power structure.

In these cases it is possible to use a circuit solution like the one illustrated in FIG. 1 in which is shown a current limitation circuit in a final stage of a power actuator. In this circuit the limitation circuit is proportional to a reference current obtained through a variable resistor Rext which is normally outside the integrated device. The output current Iout is divided and only part of it is measured through a sense resistor RS connected in series with a sense transistor PS with the obvious advantage that the output resistance is not changed.

The transistor PS, termed 'power sense', must be well coupled with the power transistor PW and is sized with an area n times smaller than the total area occupied by both the transistors. In this manner when both the transistors PW and PS work in the saturation region the current running in the transistor PS is Is=Iout/n.

The voltage drop at the ends of the resistor RS is compared by a comparator 3 with a reference voltage obtained by running a current IR of known value in a resistor RR. In particular the comparator 3 is an operational amplifier whose output is connected to the control terminals of the transistors PS and PW.

The reference current IR is generated inside the device by the circuit block 4 which generates a current proportional to the external resistor Rext.

In this circuit solution the output current Iout is limited when it reaches the value IL=K*IR where the multiplying factor K depends on the relationship of the resistors RR and RS and on the area relationship n of the transistors PS and PW in accordance with the following formula.

$$K = n \cdot \frac{R_R}{R_S}$$

The reference current IR generated by the circuit block 4 is inversely proportional to the variable resistor Rext $$I_R = \frac{V_R}{Rext}$$

Hence, in the case of a short circuit or an overload the limitation current IL will be:

$$I_L = K \cdot \frac{V_R}{Rext}$$

As may be readily seen from this last equation, the circuit block 4 is to be implemented in such a manner as to prevent the limitation current from becoming too high if, intentionally or by error, the value of the resistor Rext drops too much or is zeroed.

Two circuit solutions for generating a reference current IR inversely proportional to the value of a resistor are proposed by B. Gilbert in the article "A Versatile Monolithic Voltage-to-Frequency Converter" published in IEEE Journal of Solid-State Circuits in December 1976 and J. F. Kukielka and Solid-State Circuits in December 1976 and J. F. Kukielka and R. G. Meyer in the article "A High-Frequency Temperature-Stable Monolithic VCO" published in IEEE Journal of Solid-State Circuits in December 1981.

In the above mentioned circuits, termed by the authors "Voltage to current converter", the reference current is not limited and becomes high as the value of the resistor Rext decreases.

To obviate this problem in the prior art the circuit block 4 is commonly implemented starting from the operating principle of the circuits proposed by Gilbert, Kukielka and Meyer with the addition of other circuitry having the function of limiting the reference current.

A practical embodiment of the circuit block 4 in accordance with the prior art is shown in FIG. 2. In the diagram of FIG. 2 there can be distinguished the following circuit parts.

a MOS transistor N1,
a current generator IQ,
a regulation circuit 10 consisting of an operational amplifier 8 and a MOS transistor N2, and
a limitation current circuit 11 consisting of an operational amplifier 9, a MOS transistor N3, a reference voltage V1 and a resistor R1.

Therein can be distinguished two negative feedback loops, the one introduced by the regulation circuit 10 and the one introduced by the limitation current 11. The first feedback loop has the function of regulating the voltage on the circuit node A in such a manner that the current IR is proportional to the resistor Rext.

The second feedback loop has the function of limiting the current IR when the value of the resistor Rext falls below a certain value. In particular the current IR never exceeds the maximum value given by the following formula.

$$I_{RMAX} = \frac{V_1}{R_1}$$

The present result applied to the equation of the limitation current IL gives the maximum value which the limitation current can assume.

$$I_{LMAX} = K \cdot I_{RMAX}$$

The above mentioned solution however presents in principle the characteristic of having two negative feedback loops and this characteristic involves a considerable circuit complexity and nearly always the need for having compensation capacitors inserted in the feedback loop with the obvious disadvantage of waste of surface area on the integrated circuit.

The technical problem underlying the present invention is to generate a reference current for a circuit limiting the maximum current delivered by a power transistor and inversely proportional to the value of a resistor and at the same time self-limited while utilizing a single feedback loop.

This technical problem is solved by a circuit for limitation of the maximum current delivered by a power transistor of the type indicated and defined in this specification.

The technical problem is also solved by a power actuator protected at output from overloads and short circuits of the type indicated and defined in this specification.

The characteristics and advantages of the method in accordance with the present invention are set forth in the detailed description of an embodiment thereof given below by way of non-limiting example with reference to the annexed drawings.

DETAILED DESCRIPTION OF A PREFERRED EMBODIMENT OF THE INVENTION

Figure 3:
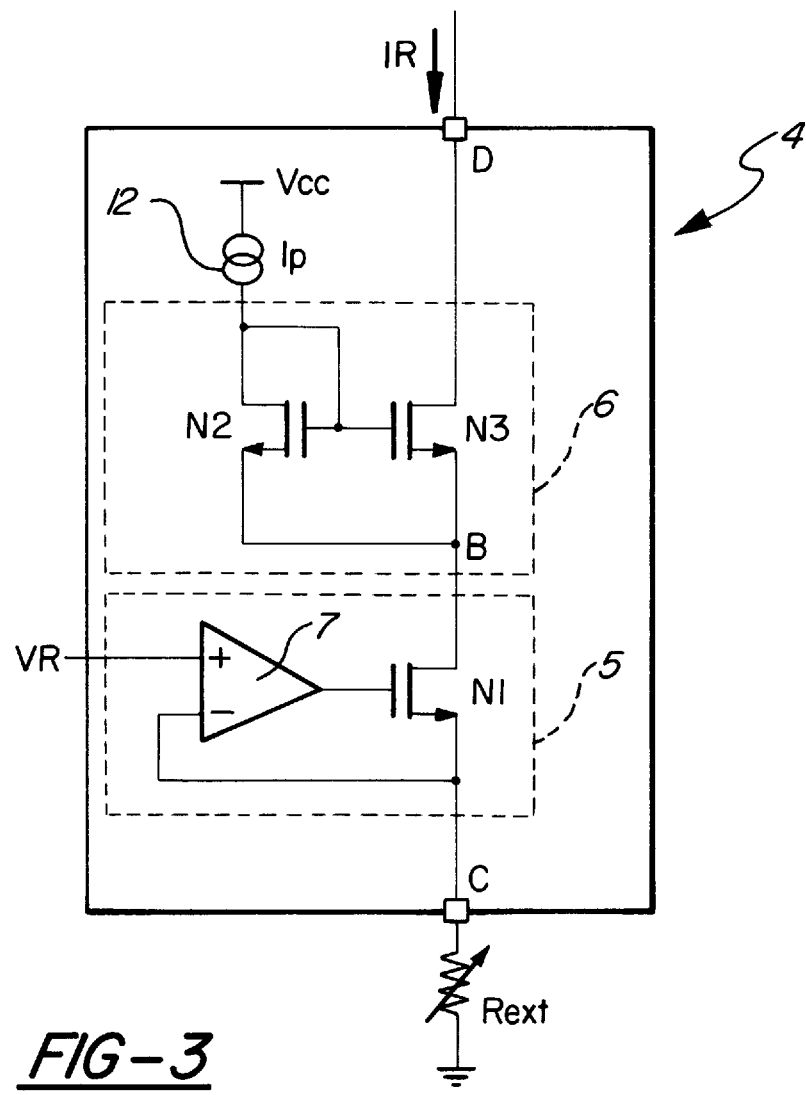
FIG. 3 shows a circuit diagram of a generator circuit generating a reference current and provided in accordance with the present invention.

FIG. 3 shows a generator circuit for generation of a reference current provided in accordance with the present invention.

Figure 1:
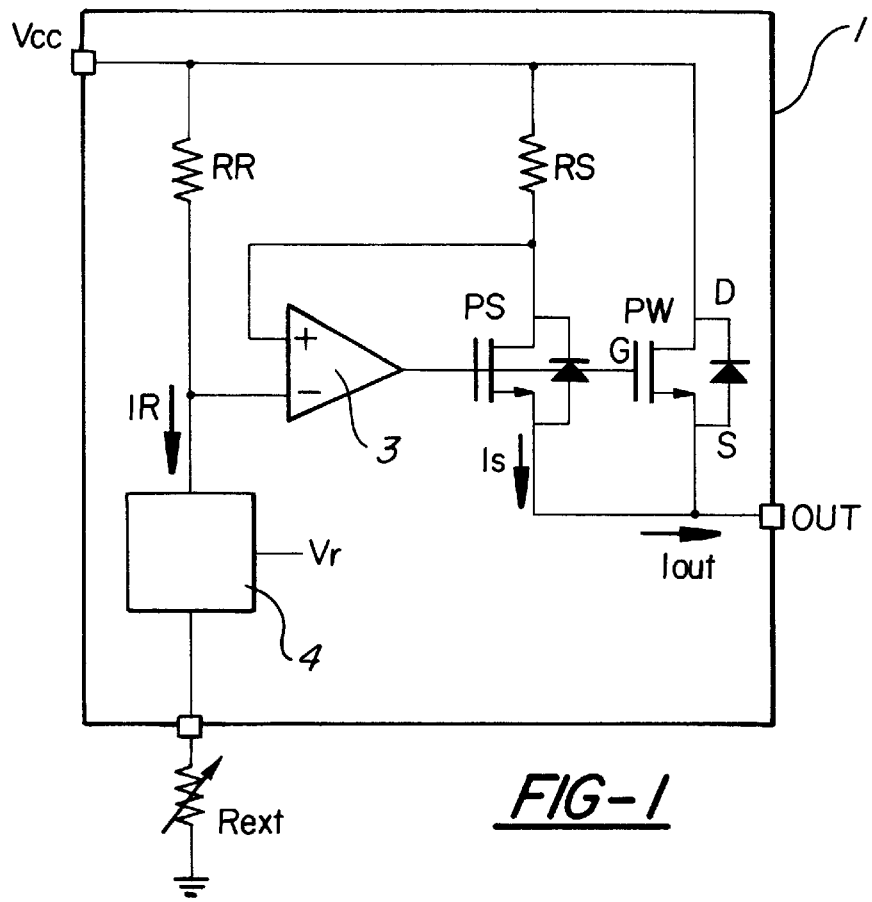
FIG. 1 shows a circuit diagram of a final stage of a power actuator incorporating a current limitation circuit.
Figure 2:
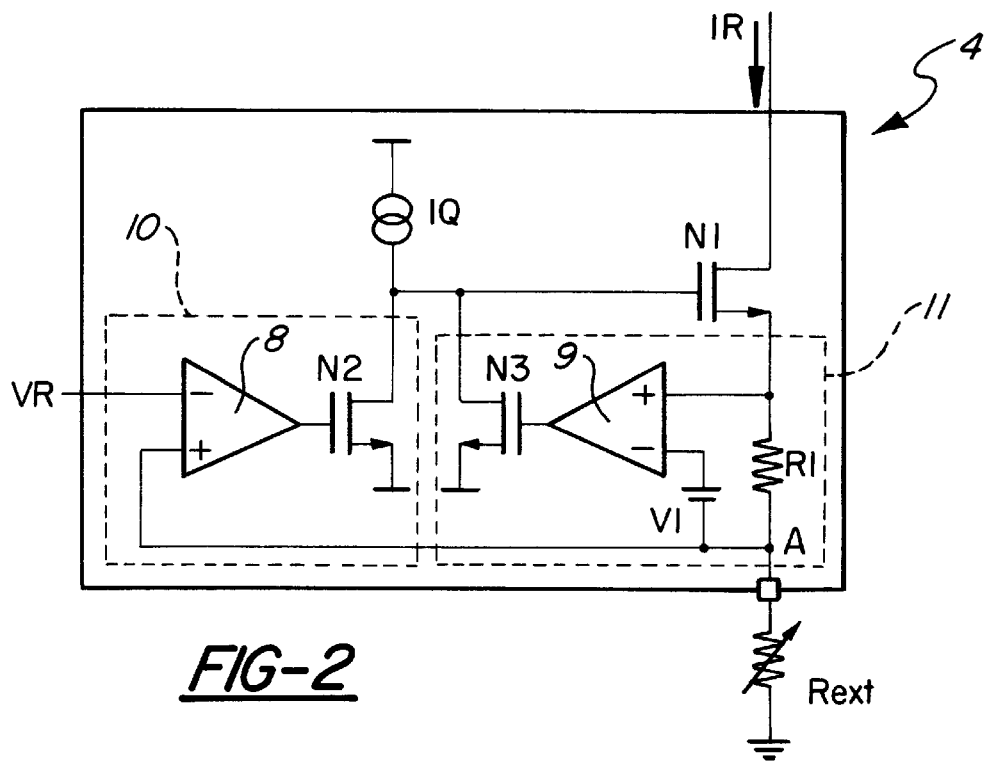
FIG. 2 shows a circuit diagram of a generator circuit for a reference current provided in accordance with the prior art.

This circuit is used in a final stage of a 'high side' power actuator such as that shown in FIG. 1 and described above and in which a power transistor PW is used for supplying power to a load with a positive voltage. Similarly, it could be used in other types of power actuator in which it is necessary to generate a programmable and self-limited reference current.

The circuit of FIG. 3, indicated as a whole by reference number 4, implements in accordance with the present invention the generator circuit for generation of the reference current 4 used in the final stage of FIG. 1.

In the circuit can be distinguished the following circuit parts:

a current generator circuit 5 consisting of an operational amplifier 7 and a transistor N1 of the MOS n-channel type, a limitation circuit 6 with current mirror provided by means of two transistors N2 and N3 of the MOS n-channel type, and a generator 12 of current Ip.

The current generator 12 must be considered not an ideal but a real current generator and thus saturating and whose current tends to zero when the generator 12 tends to saturate.

The operational amplifier 7 has an input terminal of the non-inverting type to which is applied a reference voltage VR and an inverting input terminal connected to a circuit node C. To the node C is also connected an end of a resistor Rext outside the circuit and used to set the value of the current IR.

The voltage VR is a reference voltage generated inside the device by means of a constant voltage generator of known type.

To the output terminal of the amplifier 7 is connected the control terminal of the transistor N1. This transistor N1 has a conduction path connected between the node C and a second circuit node B common with the limitation current 6.

The limitation current 6 with current mirror comprises a primary leg and a secondary leg. The primary leg consists of the transistor N2 in which flows a current Ip generated by the current generator 12. The secondary leg consists of the transistor N3 whose conduction path is connected between the common node B and a third circuit node D. Between the nodes C and D runs the current IR generated by the circuit.

The reference current IR can be calculated by applying Kirchoff's law to the node B by means of the following equation.

$$I_R + \left[ \frac{1}{m} \cdot I_R \right] - \frac{V_R}{R_{ext}} = 0$$

from which $$I_R = \frac{m}{m+1} \cdot \frac{V_R}{R_{ext}}$$

where m is the multiplication factor of the current mirror 6.

This formula for the current IR is applicable for values of Rext greater than a certain threshold value equal to $$\frac{V_R}{(m+1) \cdot I_p}$$

below which the current generator IP emerges from saturation and IR assumes the maximum value given by the following equation:

$$I_{RMAX} = m \cdot I_p$$

Hence the reference current IR generated by the circuit in accordance with the present invention is proportional to the value of the resistor Rext but self-limited to the value $I_{RMAX}$.

The current generator of FIG. 3 was used in a power actuator like that shown in FIG. 1 to generate a reference current 4 used for programming a limitation current.

In particular there were used the following values for the reference transistors, resistors and generators of FIG. 1 and FIG. 3.

| | |
|---|---|
| Power Transistor PW: | 4500 cells |
| Sense Transistor PS: | 45 cells |
| Transistor N2: | W = 100 μm |
| Transistor N3: | W = 400 μm |
| Resistor RR: | 500 Ohm |
| Resistor RS: | 10 Ohm |
| Reference voltage VR: | 1.25 Volt |
| Current generator IP: | 40 microampere |

With these data there were obtained the following values for the parameters n, k and m:

n=100 k=5000 m=4 and the following values for the limitation current IL:

$$I_L = \frac{5000}{R_{EXT}} \text{ for } R_{EXT} > 5K\Omega$$

and for the maximum limitation current $$I_{LMAX} = 1A \text{ for } R_{EXT} < 5K\Omega$$

A first advantage of the generator circuit in accordance with the present invention is the presence of a single feedback loop permitting saving the presence of at least one compensation capacitor.

In addition the circuit structure is simpler with resulting saving of area and of current absorption.

What is claimed is:

1. A circuit for limitation of the maximum current delivered by a power transistor having at least one control terminal and two principal conduction terminals which identify a principal conduction path, comprising:

a network for detection of the current delivered by the power transistor coupled with the principal conduction path of the power transistor to generate a first electrical signal proportional to said current, a reference network, for generating a second reference electrical signal, inserted between a first and a second power supply pole and comprising the series of at least one resistor and a reference current generator which generates a reference current self-limited and proportional to a third electrical reference signal, and a comparison network for comparing said first and second electrical signals and driving, by means of an output signal dependent upon said first and second signals, the control terminal of the power transistor, wherein said generator of a reference current comprises the series of a current generator circuit which generates a current proportional to said third electrical reference signal and a current mirror circuit designed to limit the maximum current delivered by the current generator circuit.

2. A circuit in accordance with claim 1, wherein the current generator circuit has a first and a second conduction terminal and a reference input terminal for receiving said third electrical reference signal and comprises:

an operational amplifier having a first input terminal connected to the reference input, a second input terminal connected to said second conduction terminal and an output terminal, and a first transistor having a control terminal connected to the output terminal of the operational amplifier and two principal conduction terminals connected respectively to said first and second conduction terminals.

3. A circuit in accordance with claim 2, wherein the first input terminal of the operational amplifier is an input of the non-inverting type and the second input terminal of the operational amplifier is an input of the inverting type.

4. A circuit in accordance with claim 3, wherein the first transistor is a transistor of the MOS n-channel type.

5. A circuit in accordance with claim 1, wherein the current mirror circuit comprises a primary leg consisting of a second transistor in which flows a current generated by a current generator and a secondary leg consisting of a third transistor in which flows the reference current.

6. A circuit in accordance with claim 5, wherein the second transistor and the third transistor are transistors of the MOS n-channel type.

7. A power actuator of the intelligent type comprising:

at least one power transistor having at least one control terminal and two principal conduction terminals which identify a principal conduction path, and a circuit for limitation of the maximum current delivered by the power transistor, comprising:

a network for detection of the current delivered by the power transistor coupled with the principal conduction path of the power transistor to generate a first electrical signal proportional to said current, a reference network for generating a second electrical reference signal inserted between a first and a second power supply pole comprising the series of at least one resistor and one reference current generator which generates a reference current self-limited and proportional to a third electrical reference signal, a comparison network for comparing said first and second electrical signals and driving by means of an output signal dependent upon said first and second signals the control terminal of the power transistor, and wherein said reference current generator comprises the series of a current generator circuit which generates a current proportional to said third electrical reference signal and a current mirror circuit designed to limit the maximum current delivered by the current generator circuit.

8. A power actuator in accordance with claim 7, wherein the current generator circuit has a first and a second conduction terminals and a reference input terminal for receiving said third electrical reference signal and comprises:

an operational amplifier having a first input terminal connected to the reference input and a second input terminal connected to said second conduction terminal and an output terminal, and a first transistor having a control terminal connected to the output terminal of the operational amplifier (7) and two principal conduction terminals connected respectively to said first and second conduction terminals.

9. A power actuator in accordance with claim 7 wherein the current mirror circuit comprises a primary leg consisting of a second transistor in which flows a current generated by a current generator and a secondary leg consisting of a third transistor in which flows the reference current.

* * * * *